(12) United States Patent
Rodgers et al.

(10) Patent No.: US 11,130,295 B2
(45) Date of Patent: Sep. 28, 2021

(54) RESIN TRANSFER MOLDING SYSTEMS AND CONTROL LOGIC FOR MANUFACTURING FIBER-REINFORCED COMPOSITE PARTS

(71) Applicant: GM Global Technology Operations LLC, Detroit, MI (US)

(72) Inventors: William R. Rodgers, Bloomfield Township, MI (US); Venkateshwar R. Aitharaju, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 146 days.

(21) Appl. No.: 16/257,801

(22) Filed: Jan. 25, 2019

(65) Prior Publication Data
US 2020/0238637 A1 Jul. 30, 2020

(51) Int. Cl.
*B29C 70/44* (2006.01)
*B29C 70/48* (2006.01)
(Continued)

(52) U.S. Cl.
CPC ............ *B29C 70/443* (2013.01); *B29C 51/20* (2013.01); *B29C 70/48* (2013.01); *H03K 19/1733* (2013.01)

(58) Field of Classification Search
CPC ..... B29C 33/308; B29C 51/20; B29C 70/081; B29C 70/443; B29C 70/48; B29C 70/546; H03K 19/1733
See application file for complete search history.

(56) References Cited

U.S. PATENT DOCUMENTS 5,581,468 A 12/1996 White et al.
7,819,462 B1 10/2010 Owens
(Continued)

FOREIGN PATENT DOCUMENTS

CN 102380958 A 3/2012
CN 106232315 A 12/2016
(Continued)

OTHER PUBLICATIONS

English translation of DE10201321257 (Year: 2014).*
(Continued)

*Primary Examiner* — Robert J Grun
(74) *Attorney, Agent, or Firm* — Quinn IP Law (57) ABSTRACT

Presented are manufacturing control systems for fabricating composite-material structures, methods for making/operating such systems, and resin transfer molding techniques for ameliorating race-tracking effects in fiber-reinforced polymer panels. A method for forming a composite-material construction includes confirming, via a system electronic control unit (ECU), that a fiber-based preform is placed in a mold cavity and that opposing mold segments of the molding apparatus are sealed together. A filler, such as a compressible bladder, a cluster of spring-biased pins, or a spray-chopped fiber bed, is introduced into a void between the fiber-based preform and a tool face of one mold segment to thereby eliminate an unwanted resin race track. The system ECU commands a resin pump to inject resin through a primary gate of the molding apparatus and into the mold cavity to thereby impregnate the fiber-based preform with the resin. One or more vents operate to evacuate air from the mold.

20 Claims, 4 Drawing Sheets

(51) Int. Cl.
*H03K 19/173* (2006.01)
*B29C 51/20* (2006.01)

(56) References Cited

U.S. PATENT DOCUMENTS

| | | | |
|---|---|---|---|
| 8,033,592 | B2 | 10/2011 | Hsu et al. |
| 8,109,492 | B2 | 2/2012 | Winocur |
| 8,309,644 | B1 | 11/2012 | Huang |
| 8,481,170 | B2 | 7/2013 | Vanimisetti et al. |
| 8,961,724 | B2 | 2/2015 | Polewarczyk et al. |
| 9,227,673 | B2 | 1/2016 | Berger et al. |
| 9,399,490 | B2 | 7/2016 | Aitharaju et al. |
| 9,650,003 | B2 | 5/2017 | Owens et al. |
| 2007/0063393 | A1 | 3/2007 | Nicolas et al. |
| 2012/0213997 | A1 | 8/2012 | Chen-Shih et al. |
| 2017/0072647 | A1* | 3/2017 | Perrillat ............ B29C 70/462 |
| 2018/0029316 | A1 | 2/2018 | Coppola et al. |
| 2018/0030922 | A1 | 2/2018 | Kia et al. |
| 2018/0030923 | A1 | 2/2018 | Coppola et al. |
| 2018/0030924 | A1 | 2/2018 | Coppola et al. |
| 2018/0031027 | A1 | 2/2018 | Coppola et al. |
| 2018/0169975 | A1 | 6/2018 | Aitharaju et al. |

FOREIGN PATENT DOCUMENTS

| | | |
|---|---|---|
| DE | 102009039116 A1 | 4/2011 |
| DE | 102011116119 A1 | 4/2013 |
| DE | 102013212571 A1 | 7/2014 |
| DE | 102015219960 A1 | 4/2017 |
| DE | 102017106850 A1 | 10/2018 |

OTHER PUBLICATIONS

Drechsler, K., Reinhart, G.; Bypassströmungen im Füllprozess textiler Strukturen: Charakterisierung, Abbildung und Optimierung, Dissertation, Technischen Universität München, May 22, 2018, 254 pages, Munich, Germany, Abstract only. No translation of entire document.

* cited by examiner

RESIN TRANSFER MOLDING SYSTEMS AND CONTROL LOGIC FOR MANUFACTURING FIBER-REINFORCED COMPOSITE PARTS

STATEMENT REGARDING FEDERALLY SPONSORED RESEARCH AND DEVELOPMENT

This invention was made with United States Government support under Contract No. DE-EE0006826 awarded by the U.S. Department of Energy (DOE). The government has certain rights in the invention.

INTRODUCTION

The present disclosure relates generally to the manufacture of fiber-reinforced composite constructions. More specifically, aspects of this disclosure relate to systems, methods, and devices for mitigating defects during molding of fiber-reinforced polymer composite panels.

Composite materials are used for manufacturing a vast array of modern products. Many current-production automobiles, watercraft, and aircraft, for example, are originally equipped with load-bearing body panels, aesthetic trim panels, support frame members, as well as various other components that are manufactured, in whole or in part, from composite materials. Fiber-reinforced plastic (FRP) is one example of a composite material that is used in mass-production manufacturing applications, favored for its high strength-to-weight ratio, increased elasticity, and lightweight properties. FRPs are typically formed by suspending a high-tensile-strength fibrous material, such as glass or carbon fibers, within a solidified polymer, such as an epoxy/resin matrix.

An available technique for fabricating fiber-reinforced plastic constructions is resin transfer molding (RTM). Many RTM processes use a hydrostatic injection system to introduce high-pressure, low-viscosity resin into a closed mold. Dry fibers, which may be in the form of a prefabricated fiber mat (or "preform"), are placed within the interior of the mold prior to introduction of the resin. After the fiber preform is positioned and the mold closed, resin is injected to fill the interior of the mold and impregnate the preform. The mold may be heated and placed under vacuum, as in vacuum assisted resin transfer molding (VARTM), to assist with resin flow. For some transfer molding techniques, the temperature of the mold may be cycled or held constant while the resin is cured; once cured, the part is removed from the RTM apparatus. RTM processes offer the economical production of composite parts with high strength characteristics, tight dimensional tolerances, complex geometries, and consistent part quality.

SUMMARY

Disclosed herein are manufacturing systems with attendant control logic for producing composite-material constructions, methods for making and methods for operating such systems, and resin transfer molding (RTM) techniques for ameliorating race tracking effects in fiber-reinforced polymer (FRP) panels. By way of example, there are presented RTM methods that mitigate part defects caused by unintentional voids or preform compression resulting from incorrect sizing or misplacement of fiber preforms within the mold cavity. The presence of such voids between the tooling and preform may lead to trapped air, increased porosity, unintentional resin flow paths, or uneven fiber density during transfer molding. This issue is ameliorated by minimizing or preventing such void areas and, thus, ensuring that there is a smooth transition between regions of varying thickness of the preform. Metered injection of chopped fibers and/or introduction of a variable-volume shim into a gap region between the fiber preform and tool face helps to eliminate unwanted void spaces around the preform. Using the preceding protocol during resin transfer molding helps to prevent resin race tracks and thereby strengthen variable-thickness segments of the resultant structure while allowing unstressed areas of the structure to be lighter weight.

Attendant benefits for at least some of the disclosed concepts include improved overall part quality of the RTM manufacturing process, minimizing trapped air in the final part and increasing part-to-part uniformity and consistency. Disclosed RTM techniques may also help to reduce the sensitivity of the molding operation to the placement of reinforcing patches, eliminating the need for precision fabrication of the fiber preforms or precision automation of preform placement. Disclosed techniques also help to preempt the occurrence of defects (void formation) and, thus, curtail the overall number of defective parts. Additional benefits may include a reduction in scrap complemented with a concomitant reduction of material costs. Disclosed techniques may also help to mitigate any endemic uncertainty in the manufacture of composite-material constructions that is oftentimes caused by variations in raw materials, unavoidable race tracking, and incongruences in processing conditions.

Aspects of the present disclosure are directed to transfer molding processes with quality control features for mitigation of racetrack-borne defects in fiber-reinforced polymer panels. In an example, a method is presented for forming a composite-material construction using a molding system. This molding system includes opposing mold segments that, when sealed together, cooperatively define a closed mold cavity. One or more gates and one or more vents are fluidly connected to the mold cavity to introduce resin and evacuate air from the cavity, respectively. A programmable electronic control unit (ECU) regulates operation of the molding system. The foregoing representative method includes, in any order and in any combination with any of the above and below options and features: receiving, e.g., via the system ECU from a suitable sensor or a human-machine interface (HMI), an electronic signal indicating a fiber-based preform is placed in the mold cavity; receiving, e.g., via the system ECU from a suitable sensor or the HMI, an electronic signal indicating the mold segments are closed and sealed together; prior to or after closing the mold, introducing a filler into one or more voids between the fiber-based preform and a tool face or faces of one of both mold segments to thereby eliminate any unwanted resin race tracks; transmitting, via the system ECU to the primary vent(s), one or more command signals to evacuate air from the mold cavity; transmitting, via the system ECU to a resin pump, one or more command signals to inject resin through the primary gate(s) and into the mold cavity to thereby impregnate the fiber-based preform; and, following a predetermined cure time, transmitting an open signal to open the tool such that the cured part may be removed.

Other aspects of the present disclosure are directed to manufacturing control systems for mitigating the effects of resin race tracking on fiber-reinforced polymer panels. As an example, a resin transfer molding system for forming a fiber-reinforced polymer construction is presented. The RTM system includes a hydrostatic molding apparatus with opposing upper and lower mold segments that, when sealed together, define therebetween a closed mold. One or more cavity gates introduce resin into the mold cavity, while one or more cavity vents evacuate air from the mold cavity. A system ECU, which may comprise one or more controllers resident to and/or remote from the molding system, is communicatively connected to the molding apparatus and is programmed to effect processor-executable instructions stored in a main, auxiliary and/or remote memory device. The molding system may also be equipped with a distributed array of sensors mounted to the molding apparatus. Each sensor is individually operable to monitor a system parameter at a discrete location and output one or more signals indicative thereof.

Continuing with the preceding example, the programmable ECU receives an electronic (alignment) signal that indicates a fiber-based preform has been placed into the mold cavity. For at least some implementations, proper preform placement may be confirmed manually. At this juncture, the system ECU may send a signal to a controller for a gantry or robot to enter the tool and add filler to one or more potential racetrack areas. The ECU also receives an electronic (sealed) signal indicating the opposing mold segments have been closed and sealed together. A filler device, which may be in the nature of a compressible shim, a cluster of independently actuable profile gauge pins, or a pneumatic chopped-fiber gun, introduces a filler into one or more voids between the preform and the tool face/faces of one or both dies (prior to or after closing the mold). One or more vents are contemporaneously commanded open to evacuate air from the mold cavity. The system ECU thereafter commands a resin pump to inject resin through the primary gate(s) and into the mold cavity to thereby impregnate the fiber-based preform with the resin. Upon completion of an appropriate cure time, the FRP part may be removed from the mold cavity. The filler device may be an integral part of the hydrostatic molding apparatus or may be a separate component that is introduced, e.g., via controlled robotic placement.

Additional aspects of the present disclosure are directed to methods for assembling and methods for operating any of the disclosed manufacturing control systems. Aspects of the present disclosure are also directed to fiber-reinforced polymer structures formed from any of the disclosed methods. Also presented herein are non-transitory, computer readable media storing instructions executable by at least one of one or more processors of one or more molding system controllers, integrated circuit devices, or dedicated control modules, to carry out any of the disclosed methods, techniques, and algorithms.

The above summary is not intended to represent every embodiment or every aspect of the present disclosure. Rather, the foregoing summary merely provides an exemplification of some of the novel concepts and features set forth herein. The above features and advantages, and other features and attendant advantages of this disclosure, will be readily apparent from the following detailed description of illustrated examples and representative modes for carrying out the present disclosure when taken in connection with the accompanying drawings and the appended claims. Moreover, this disclosure expressly includes any and all combinations and subcombinations of the elements and features presented above and below.

The present disclosure is amenable to various modifications and alternative forms, and some representative embodiments are shown by way of example in the drawings and will be described in detail herein. It should be understood, however, that the novel aspects of this disclosure are not limited to the particular forms illustrated in the above-enumerated drawings. Rather, the disclosure is to cover all modifications, equivalents, combinations, subcombinations, permutations, groupings, and alternatives falling within the scope of this disclosure as encompassed by the appended claims.

DETAILED DESCRIPTION

This disclosure is susceptible of embodiment in many different forms. Representative embodiments of the disclosure are shown in the drawings and will herein be described in detail with the understanding that these embodiments are provided as an exemplification of the disclosed principles, not limitations of the broad aspects of the disclosure. To that extent, elements and limitations that are described, for example, in the Abstract, Introduction, Summary, and Detailed Description sections, but not explicitly set forth in the claims, should not be incorporated into the claims, singly or collectively, by implication, inference or otherwise. For purposes of the present detailed description, unless specifically disclaimed: the singular includes the plural and vice versa; the words "and" and "or" shall be both conjunctive and disjunctive; the words "any" and "all" shall both mean "any and all"; and the words "including," "containing," "comprising," "having," and the like, shall each mean "including without limitation." Moreover, words of approximation, such as "about," "almost," "substantially," "approximately," and the like, may be used herein in the sense of "at, near, or nearly at," or "within 0-5% of," or "within acceptable manufacturing tolerances," or any logical combination thereof, for example.

Figure 1:
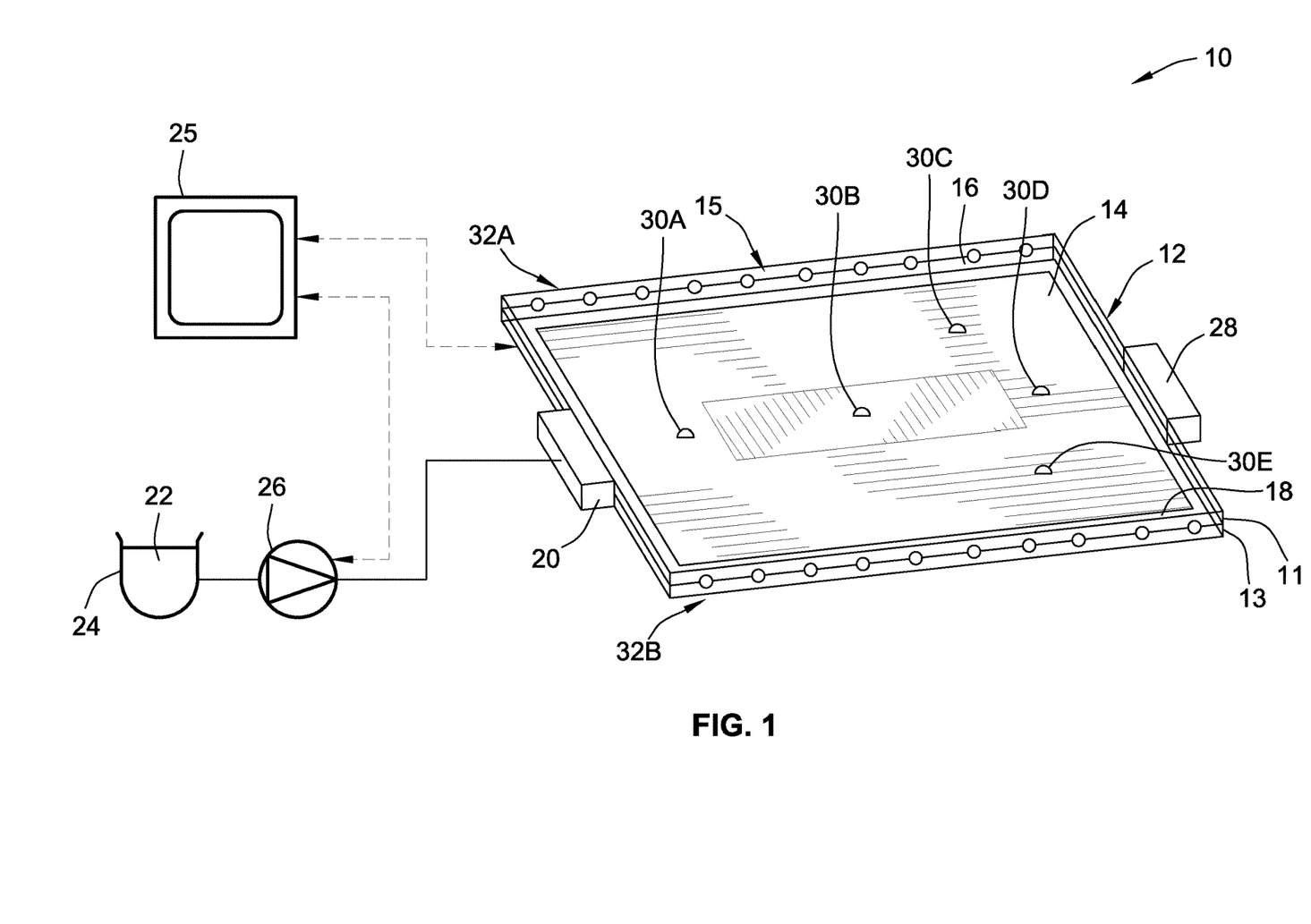
FIG. 1 is a schematic perspective-view illustration of a representative resin transfer molding system for manufacturing fiber-reinforced polymer composite constructions in accordance with aspects of the present disclosure.

Referring now to the drawings, wherein like reference numbers refer to like features throughout the several views, there is shown in FIG. 1 a representative composite-material manufacturing system, which is designated generally at 10 and portrayed herein for purposes of discussion as a controller-automated resin transfer molding (RTM) apparatus. The illustrated composite-material manufacturing system 10—also referred to herein as "molding system" or "RTM system" for short—is merely an exemplary application with which aspects and features of this disclosure may be practiced. In the same vein, implementation of the present concepts for fabricating carbon-fiber-reinforced, resin-based polymer panels should also be appreciated as a representative application of disclosed aspects and features. As such, it will be understood that aspects and features of this disclosure may be implemented for manufacturing other composite-material constructions, and may be incorporated into any logically relevant type of transfer molding architecture. Moreover, only select components of the RTM system 10 have been shown in the drawings and will be described in detail herein. Nevertheless, the systems and devices discussed below can include numerous additional and alternative features, as well as other available and hereinafter developed peripheral components, without departing from the intended scope of this disclosure. Lastly, the appended drawings are not necessarily to scale and are provided purely for instructional purposes. Thus, the specific and relative dimensions shown in the drawings are not to be construed as limiting.

RTM system 10 of FIG. 1 may employ a hydrostatic, thermoset-curing, liquid-resin molding apparatus to fabricate multidimensional fiber-reinforced polymer (FRP) panels. In accord with the illustrated example, RTM system 10 is represented, in part, by a closed mold 12 fashioned as a bipartite construction with a first mold segment 11 (upper tooling die) that sealingly mates with a complementary second mold segment 13 (lower tooling die) to define therebetween a sealable chamber or "mold cavity." In contrast to open mold configurations, which are typically open to the atmosphere during injection and curing, a "closed mold" may be typified by an enclosed mold cavity with a gating system of fluid passages that regulate the introduction and evacuation of a pressurized casting polymer into and out of the mold. To this end, the first and/or second mold segments 11, 13 may be hydraulically-actuated to facilitate movement of the tooling segments 11, 13 toward and away from each other. Induction coils, fluid conduits for circulating heated oil or water, or electrical resistance heaters (not shown) may attach to or extend through each tooling segment 11, 13 to facilitate selective heating of the mold 12.

A fiber-based preform 14 of any desired shape and material, such as a carbon-fiber mat or glass-fiber roving, sits within a mold cavity 15 on an upper surface of the lower mold segment 13, also referred to as the "lower tool face" of the mold 12. Seal/index pins (not shown) project from complementary recesses in the upper and/or lower mold segments 11, 13 to accurately position the fiber-based preform 14 in the mold cavity 15. At least some applications may require the fiber-based preform 14 be laid-up by hand on lower mold portion 13 of mold 12; other system architectures may automate this and any other stage of the RTM process using a programmable electronic controller 25 (also referred to herein as "electronic control unit" or "ECU"). The reinforcing fibers used to prefabricate the fiber-based preform 14 may be composed of any suitable material or combination of materials used as reinforcing fibers, such as carbon fibers, glass fibers, aramid fibers, boron fibers, basalt fibers, metal fibers, and any combination thereof. Preforms of various weight, weave, and fiber orientation may be used. For other optional configurations, at least one of the mold segments 11, 13 may be equipped with a flexible vacuum bag, e.g., made of silicone rubber or other suitable flexible material, to accommodate a vacuum assisted resin transfer molding process.

To facilitate resin transfer, one or both mold segments 11, 13 may be formed or machined with resin grooves, channels, or other fluid conduits 16 and 18 generally defined between the inner surface of the mold 12 and the fiber-based preform 14. Each resin channel 16, 18 is fluidly coupled to one or more resin inlet ports, represented herein by a primary gate 20, through which a curable polymer casting agent is introduced into the mold cavity 15. This curable polymer may take on any appropriate form, including liquefiable thermoset and/or thermoplastic matrix resins suitable for use in the production of transfer molded articles. Some specific, yet non-limiting examples of suitable resins include epoxy resin, phenolic resin, melamine resin, unsaturated polyester resin, polyurethane resin, maleimide resin, silicone resin, cyanic acid ester resin, vinyl ester resin, polyamides, and polyether ketones, as well as hybrids, combinations and modifications thereof. The resin may be deaerated prior to ejection to provide an improved resin matrix with reduced voids. During processing, the resin, which may have a high viscosity (e.g., about 5,000 to 20,000 cp) at room temperature, may be heated to a temperature that would melt the resin to a low viscosity (e.g., about 50-300 cp at 130° C.) and allow the resin to flow more readily.

Once the fiber-based preform 14 is laid up on the lower mold segment 13, the upper mold segment 11 is then closed and sealed with lower segment 13, e.g., via a clamp (not shown). Once the mold cavity is sealed, the entrapped air may be evacuated through a primary vent 28. After the air is removed, the primary vent 28 is sealed. Liquid resin 22 is pulled from a resin supply 24 and injected into the mold cavity 15 through primary gate 20 via resin pump 26, the operation of which is governed by the electronic controller 25. Infusing the resin 22 may occur at ambient temperatures under vacuum pressure; alternatively, in at least some optional embodiments, resin infusion may be gravity-fed and may take place by applying heat to an elevated resin reservoir 24, the mold 12, and/or any interconnecting fluid conduits. When the mold cavity 15 is substantially filled and, thus, the fiber-based preform 14 is saturated with resin 22, resin injection is stopped and the resin is allowed to cure. It will be readily recognized that alternative means may be employed to impregnate the fiber-based preform 14 with resin 22, including vacuum pressure, piston-driven injection, autoclave, and other conventional mechanisms for generating pressure.

Throughout the RTM process, system operating parameters occurring throughout the mold 12 are advantageously detected by a distributed array of sensors. For instance, FIG. 1 portrays five discrete sensors 30A, 30B, 30C, 30D and 30E. Each of these sensors 30A-30E is operatively attached to the mold 12, either completely integrated into one of the mold segments 11, 13 or, alternatively, situated with a main sensor body mounted outside of the mold 12 and a linked sensing element mounted to one of the mold segments 11, 13. Real-time, online sensor data of temperature/pressure at various discrete locations within the mold cavity 15 is measured by the sensors 30A-30E and transmitted to the electronic controller 25 at any juncture during the RTM process. It should be appreciated that the number, locations, and configurations of the distributed array of sensors 30A-30E may be varied, for example, to accommodate the design requirements and quality control restrictions of an intended application. Other optional hardware may include a first series of individually operable secondary vents (collectively designated as 32A) equidistantly spaced along a left flank of the mold 12, and a second series of individually operable secondary vents (collectively designated as 32B) equidistantly spaced along a right flank of the mold 12.

As indicated above, the electronic controller 25 is constructed and programmed to govern, among other things, various stages of the RTM process, including operation of the primary gate 20 and vent 28, the pump 26, and the two series of secondary vents 32A, 32B. Controller, control module, module, control unit, electronic control unit, processor, and any permutations thereof may be used interchangeably and may be defined to mean any one or various combinations of one or more of logic circuits, Application Specific Integrated Circuit(s) (ASIC), electronic circuit(s), central processing unit(s) (e.g., microprocessor(s)), combinational logic circuit(s), input/output circuit(s) and devices, and associated memory and storage (e.g., read only, programmable read only, random access, hard drive, tangible, etc.)), whether resident, remote or a combination of both. Controller 25 may be integrated circuit (IC) hardware programmed to execute one or more software or firmware programs or routines, e.g., using appropriate signal conditioning and buffer circuitry, and other components to provide the described functionality.

Software, firmware, programs, instructions, routines, code, algorithms and similar terms may be used interchangeably and may be defined to mean any controller-executable instruction sets, including calibrations and look-up tables. A controller may be designed with a set of control routines executed to provide any of the disclosed functions and operations. Control routines are executed, such as by a central processing unit, and may be operable to monitor inputs from sensing devices and other networked control modules, and may execute control and diagnostic routines to control operation of devices and actuators. Routines may be executed in real-time, continuously, systematically, sporadically, and/or at regular intervals, for example, each 100 microseconds, 3.125, 6.25, 12.5, 25 and 100 milliseconds, etc., during ongoing system use or operation. Alternatively, routines may be executed in response to occurrence of a designated event or list of designated events during operation of a system.

FIGS. 2-5 illustrate four representative RTM apparatuses 140, 240, 340 and 440, respectively, that are designed to mitigate FRP part defects caused by unintentional voids or preform compression resulting from incorrect sizing and/or misplacement of fiber preforms within an internal mold cavity. Although differing in appearance, the RTM apparatuses 140, 240, 340, 440 of FIGS. 2-5 may each be incorporated into RTM system 10 of FIG. 1 or may be modified to include any of the options and features describe above with respect to the RTM system 10, and vice versa. For instance, each RTM apparatus 140, 240, 340, 440 includes a first mold segment 111, 211, 311, 411 (upper tooling die) that sealingly mates with a complementary second mold segment 113, 213, 313, 413 (lower tooling die) to define therebetween a mold cavity 115, 215, 315, 415. A complementary fiber-based preform 114, 214, 314, 414 is situated within each mold cavity 115, 215, 315, 415, buttressed on the tool face of the lower mold segment 113, 213, 313, 413.

Figure 2:
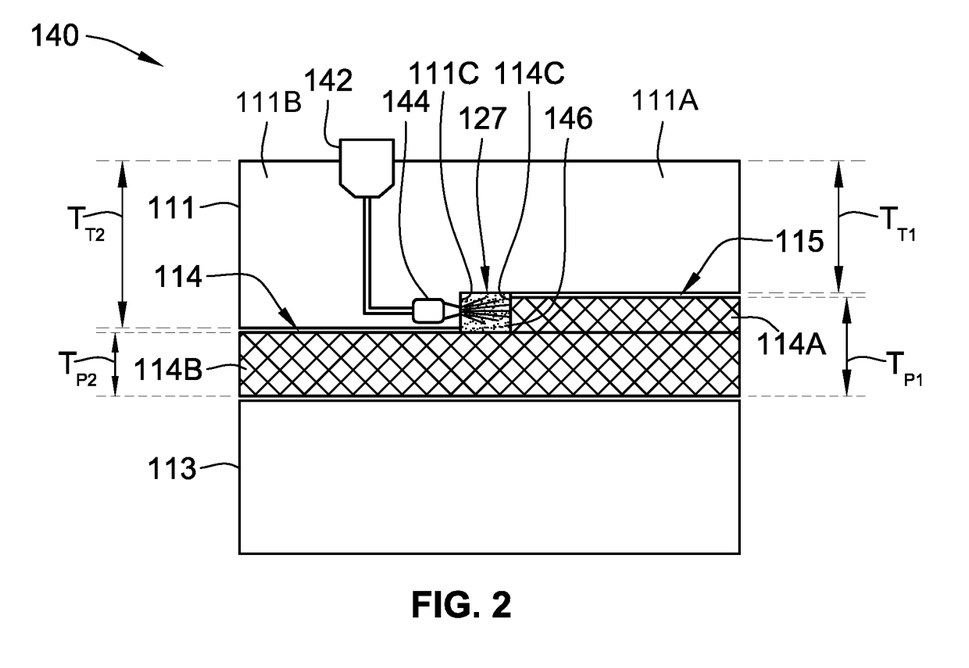
FIG. 2 is a schematic side-view illustration of a representative resin transfer molding apparatus with a pneumatic spray-chopped fiber injection gun in accordance with aspects of the present disclosure.

Natural variations in the size and placement of a fiber-based preform may create undesirable manufacturing conditions, such as unintentional air gaps or crushed sections of preform, which cause porosity, dry fibers, or other defects in the resultant FRP parts. In some applications, the final fiber preform employed for transfer molding may be composed of multiple layers of discrete fiber preforms. A "reinforcement patch" is a subordinate layer of reinforcing fibers that, when seated on a primary preform layer, results in a final fiber preform with sections of varying thicknesses. Manufacturing-tolerance borne variations in and inconsistent placement of a reinforcement patch may lead to inadvertent voids or preform compression at a transition area between preform sections having differing thicknesses. With reference to FIG. 2, for example, the fiber-based preform 114 is assembled from a reinforcement patch layer 114A that is mounted onto a subajacent primary preform layer 114B, creating adjoining right and left preform sections with respective preform thicknesses $T_{P1}$ and $T_{P2}$. A stepped preform region 114C is interposed between and provides a transition point for the adjoining preform sections. In the same vein, the upper tooling die 111 includes adjoining right and left tool sections 111A and 111B, respectively, with respective tool thicknesses $T_{T1}$ and $T_{T2}$. A stepped tool region 111C is interposed between and provides a transition point for the adjoining tool sections 111A, 111B. In this exaggerated example, the undersized reinforcement patch layer 114A creates a void 127 between the stepped tool region 111C and stepped preform region 114C. While many commercially available RTM systems may inadvertently employ undersized or oversized reinforcement patches, the RTM apparatus 140 of FIG. 2 may utilize a reinforcement patch layer 114A with a nominal size (e.g., patch width) that is engineered to be smaller than a nominal size (e.g., cavity width) of the right tool section 111A to ensure that the patch 114A stays within the bounds of the tool area, irrespective of inconsistencies in cutting or placement.

RTM apparatus 140 of FIG. 2 is equipped with an automated filler device that is selectively operable to substantially fill an air gap or "void" 127 between the upper tooling die 111 and fiber-based preform 114 and thereby minimize or eliminate unwanted formation of a resin race track. According to the illustrated example, an air-driven fiber chopper 142 is operatively attached to the RTM apparatus 140 and fluidly connected to a pneumatic fiber-spray gun 144. Pneumatic fiber-spray gun 144 may be fixed directly to the upper tooling die 111 and placed coterminous with the stepped tool region 111C such that the gun nozzle opens into the void 127 when the opposing tooling dies 111, 113 are sealed closed. The fiber chopper 142 and spray gun 144 may be supplied with pressurized air from a compressed air supply (not shown). Fiber chopper 142 may be in the nature of a rotary chopper that receives continuous fiber roving and cuts the roving into discrete lengths of fiber that are expelled through the spray gun 144. While shown with a single filler device to fill one void between a lone preform and a single tooling die, disclosed RTM systems and apparatuses may employ any number or combination of filler devices to plug any number of voids between one or more preforms and one or more tooling dies.

Activation of the air-driven fiber chopper 142 and pneumatic fiber-spray gun 144 of FIG. 2, e.g., via RTM system ECU 25 of FIG. 1, injects a metered volume of a chopped-fiber filler 146 into the void 127 region between the fiber-based preform 114 and the tool face of the tooling die 111. The injected filler 146 material may have a low initial fiber volume fraction to ensure that the resultant spray-chopped fiber bed readily deforms under compression between the mold segments 111, 113 to match a desired part topology and, thus, buffer the transition in volume fraction between the fiber bed and patch 114A. In this regard, the fiber-based preform may be fabricated with a (first) preset volume fraction of fiber (e.g., about 45-55%), whereas the chopped-fiber filler is injected with a distinct (second) volume fraction of fiber (e.g., about 5-30%) that is quantifiably less than the preform's volume fraction of fiber. It may be desirable, for at least some applications, that the spray-chopped fiber bed's initial fiber volume fraction is approximately 10-60% of the preform's initial fiber volume fraction. The term "volume fraction" may be defined in accordance with the customary meaning accorded by those skilled in the art, including a percentage of a constituent part (e.g., fiber volume) in all constituent parts (e.g., total volume of final composite).

With continuing reference to FIG. 2, the chopped-fiber filler 146 material may be chosen to match that of the fiber material or materials of the fiber-based preform 114 or a layer 114A, 114B thereof. By way of non-limiting example, the chopped-fiber filler may comprise or, if desired, consist essentially of a spray-chopped reinforcing fiber bed composed of glass, carbon, aramid, boron, metal, and/or basalt fibers. Disclosed RTM systems and apparatuses may utilize a tow size of about 3,000 to about 50,000 fibers in a tow or, in a more specific yet non-limiting example, about 24,000 to 50,000 fibers in a tow. For this purpose, an approximate length of the chopped fibers may vary from about 6 mm to about 25 mm or, more advantageously, from about 8 mm to about 15 mm or, yet more advantageously, from 10 mm to 12 mm. Each fiber may have a diameter of about 2-45 micrometers (µm) or, in some embodiments, about 5-25 µm. To improve adhesion and cohesion, the injected fibers 146 may be entrained or coated with a thermoplastic or thermoset binder or binding agent, such as a polyurethane, epoxy, polyacrylate, and/or styrene-butadiene latex binder, that binds the chopped-fiber filler 146 to the fiber-based preform 114. For at least some embodiments, the filler includes about 0.25% to about 10% by weight of binder material or, in some applications, about 1.0% to about 5.0% by weight of binder material. Ideally, a width of the sprayed area would match a width of the air gap; however, recognizing that this may not be possible, a width of the sprayed area may be from about 5 mm to about 30 mm or, in some embodiments, from about 5 mm to about 10 mm or, in at least some embodiments, 5 mm to 7 mm.

Figure 3:
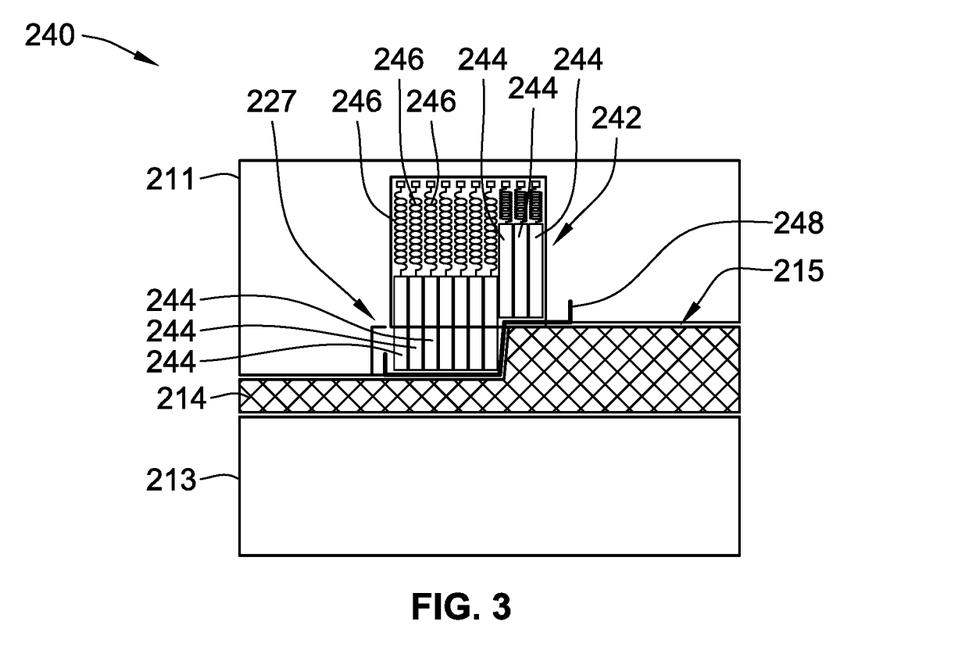
FIG. 3 is a schematic side-view illustration of a representative resin transfer molding apparatus with a surface profile gauge in accordance with aspects of the present disclosure.

Similar to RTM apparatus 140 of FIG. 2, RTM apparatus 240 of FIG. 3 is equipped with an air-gap filler device that is operable to substantially fill an unintended airgap/void 227 sandwiched between and enclosed by the downward-facing tool face of the upper tooling die 211 and a top surface of the fiber-based preform 214. In the illustrated example, a self-actuating profile gauge 242 is housed within the main body of the upper tooling die 211 and operable as a dynamic surface topology that conforms the tool face of the tooling die 211 to the contoured upper surface of the preform 214. Profile gauge 242 employs a cluster of elongated, cylindrical pins 244 that are movably mounted within an internal compartment of the mold segment 211. Each pin 244 is independently actuated by a dedicated biasing member 246 (e.g., helical compression spring) to project downward from the tool surface of the upper tooling die 211. When the preform is seated in the mold cavity 215 and the opposing mold segments 211, 213 are closed, the cluster of pins 244 presses against the preform 214. The spring force of the biasing members 246 is sufficiently low to ensure the pins 244 do not perceptibly compress the preform 214, yet is sufficiently high to push the pins 244 rectilinearly downward into the void 227.

Profile gauge pins 244 of FIG. 3 may be closely arranged in an array of multiple rows and multiple columns of pins. To help ensure a compact grouping, the pins 244 may have a polyhedral geometry with a square transverse cross-section in which peripheral surfaces of each pin 244 slidably abut the peripheral surfaces of neighboring pins 244. Each pin 244 may have a contoured tip and, optionally, a width of approximately 1-2 mm. While described above as independently actuable pins, the cluster of pins 244 may be grouped into subsets that are jointly retractable into and translatable out of the upper tooling die 111. Profile replication effected by the profile gauge pins 244 may be teamed with a flexible, elastomeric sheet 248 that lays across the top of the preform 214 at the thickness transition region underneath the pins 244, e.g., to allow for larger pin tolerances and prevent resin from leaking between the pins. It is further envisioned that alternative means may be used to control the extension and retraction of the pins, including hydraulic actuators, pneumatic actuators, and/or electronic linear actuators controlled by the system ECU to selectively retract and extend the pins into and out from the first tool face.

Figure 4:
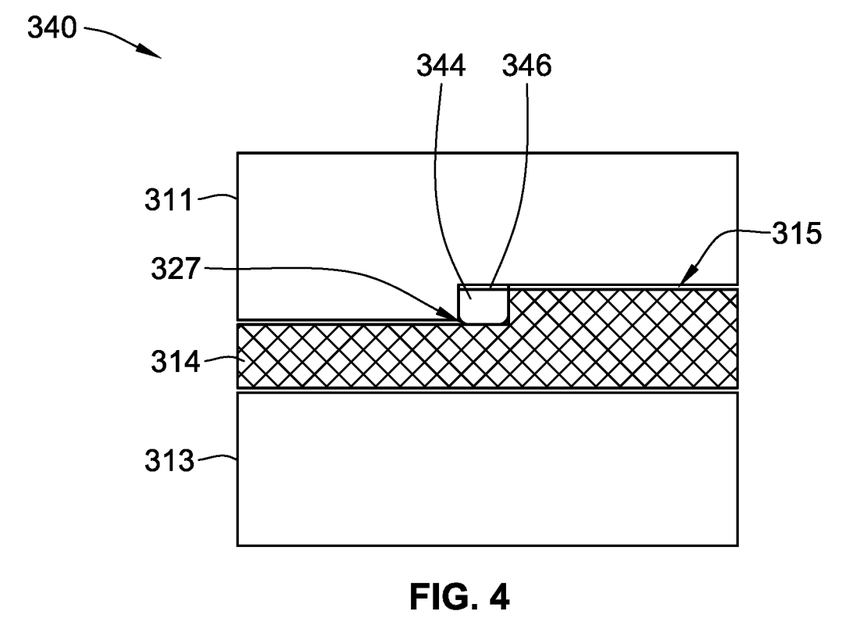
FIG. 4 is a schematic side-view illustration of a representative resin transfer molding apparatus with a compressible shim in accordance with aspects of the present disclosure.
Figure 5:
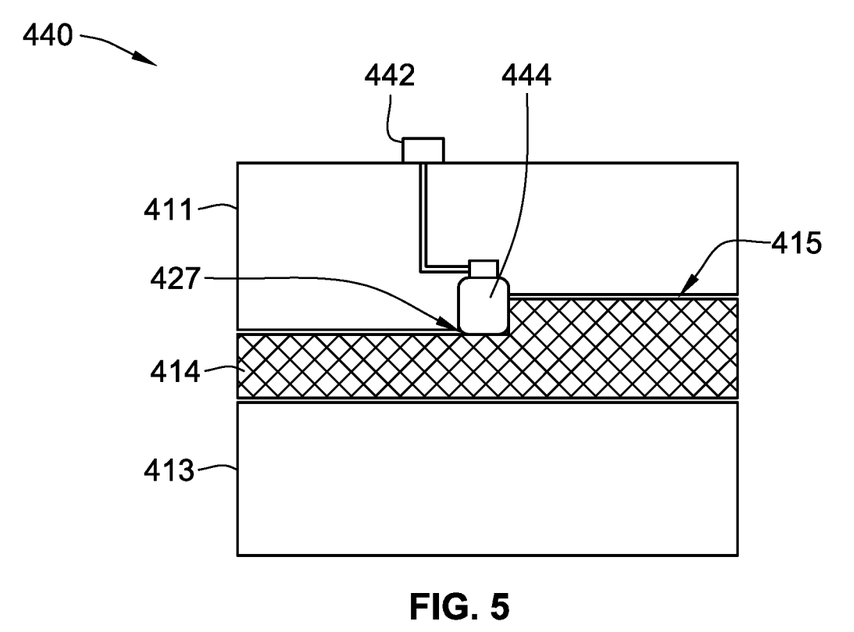
FIG. 5 is a schematic side-view illustration of a representative resin transfer molding apparatus with a pneumatically or hydraulically expandable bladder in accordance with aspects of the present disclosure.

RTM apparatuses 340 and 440 of FIGS. 4 and 5 are shown equipped with either a passive or an active void-filler device, each of which is designed to substantially fill one or more unwanted voids 327, 427 trapped between the upper tooling die 311, 411 and the fiber-based preform 314, 414 during transfer molding. The RTM apparatus 340 of FIG. 4, for example, incorporates a compressible cushion 344 that is rigidly mounted via cushion base 346 to the downward-facing tool face of the mold segment 311. Cushion 344 is shaped and sized to press against the fiber-based preform 314—without significantly compacting the preform 314—when the opposing tooling dies 311, 313 are closed and sealed. The cushion 314 is located at the thickness transition region of the preform 314 to partially or completely fill the void 327. The compressible cushion 344 may be formed from an elastomeric material or a combination of elastomeric materials, such as of a silicone rubber, a neoprene rubber, a fluoroelastomer rubber, and/or any suitably elastic material. For at least some applications, the elastomeric material has a low stiffness (e.g., a Shore 00 hardness of about 20-60 or a Shore A harness of less than 30) but a high elastic limit and/or negligible permanent set (e.g., a low Young's Modulus of about 0.1-1.0 MPa) to ensure the cushion 344 will conform to different surface profiles yet will return to its initial shape when unloaded. While shown as a solid body construction (i.e., one without perceivable internal voids), the cushion 344 may be formed with a hollow body or a liquid-filled body. It is further envisioned that the cushion 344 may take on alternative shapes, sizes, orientations, and/or locations from that which are shown in the drawings. Any of the illustrated filler devices may be an integral part of the hydrostatic molding apparatus, as shown, or may be a separate component that is introduced, e.g., via controlled robotic placement or a translating gantry.

In contrast to the passive void-filler device utilized by the RTM apparatus 340 of FIG. 4, the RTM apparatus 440 of FIG. 5 is equipped with a controller-regulated "active" void-filler device for preventing the inadvertent formation of resin race tracks between a resin-based preform and a tool die surface. According to the illustrated example, a pneumatic actuator, such as air pump 442, is operatively attached to the RTM apparatus 440 and fluidly connected to an inflatable pouch 444. Inflatable pouch 444 is housed within the main body of the upper tooling die 411 and selectively actuable to conform to a section of the contoured upper surface of the preform 414. Pouch 444 is actuated by the dedicated air pump 442 to project out of an internal compartment of the upper tooling die 411, downward from the tool surface, and into direct contact with the preform 414. During a transfer molding operation, the air pump 442 of FIG. 4 is activated, e.g., via RTM system ECU 25 of FIG. 1, to govern an internal pressure of the inflatable bladder pouch 444. The internal pressure is regulated to be sufficiently low to ensure the pouch 444 does not perceptibly compress the preform 414, yet is sufficiently high to inflate the pouch 444 to a volume that substantially fills the void 427. Similar to the cushion 344 of FIG. 4, inflatable pouch 444 of FIG. 5 may take on alternative shapes, sizes, orientations, and/or locations from that which are shown in the drawings. Likewise, alternative means may be employed for actively controlling the pressure exerted by the pouch 444, including hydraulic and/or pneumatic devices, e.g., to match bladder pressure to injected resin pressure as it passes the transition region.

Figure 6:
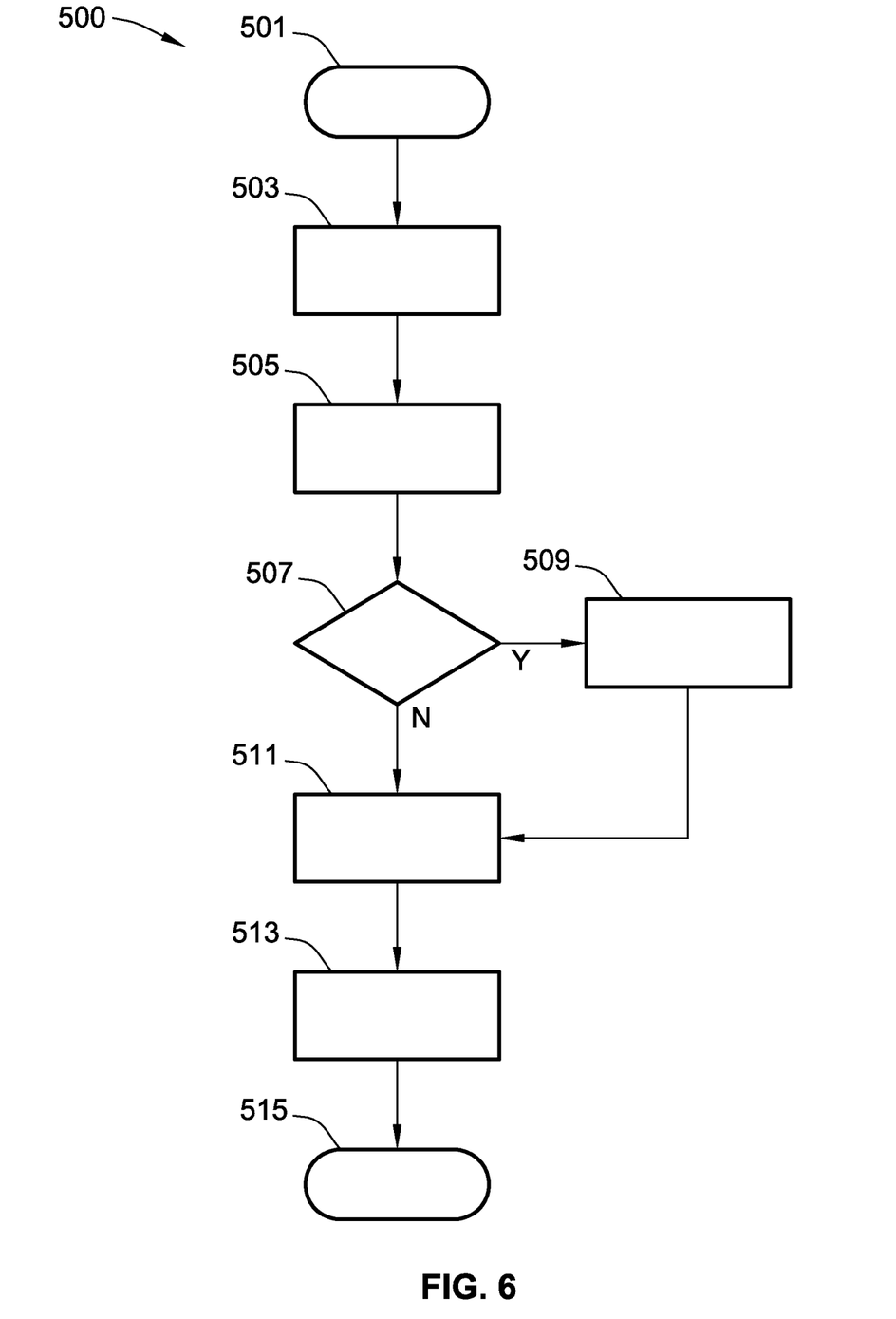
FIG. 6 is a flowchart illustrating a representative manufacturing control algorithm for governing operation of a resin transfer molding system, which may correspond to memory-stored instructions executed by resident or remote control-logic circuitry, programmable electronic control unit, or other computer-based device or network of devices in accord with aspects of the disclosed concepts.

With reference now to the flowchart of FIG. 6, an improved method or control strategy for governing operation of a molding system, such as RTM manufacturing system 10 of FIG. 1, including a transfer molding apparatus, such as RTM apparatuses 140, 240, 340, 440 of FIGS. 2-5, is generally described at 500 in accordance with aspects of the present disclosure. Some or all of the operations illustrated in FIG. 6 and described in further detail below may be representative of an algorithm that corresponds to processor-executable instructions that may be stored, for example, in main or auxiliary or remote memory, and executed, for example, by a resident or remote controller, processing unit, control logic circuit, or other module, device and/or network of devices, to perform any or all of the above or below described functions associated with the disclosed concepts. It should be recognized that the order of execution of the illustrated operation blocks may be changed, additional blocks may be added, and some of the blocks described may be modified, combined, or eliminated.

Method 500 begins at terminal block 501 of FIG. 6 with processor-executable instructions for a programmable controller or control module or similarly suitable processor, such as RTM system controller 25 of FIG. 1, to call up an initialization procedure for a protocol to monitor and regulate the forming of a composite-material construction using a molding apparatus. With continuing reference to the architecture of FIG. 1 as a representative implementation of the methodology set forth in FIG. 5, the controller 25 may be operable to receive, process and synthesize pertinent information and inputs, and execute control logic and algorithms to regulate various RTM system 10 components and attendant operations to achieve desired control targets and outputs. RTM system controller 25 may be programmed with algorithms for predicting and controlling the manufacture of composite materials. These algorithms may be used to infer a void condition between a tooling die surface and a fiber-based preform during a resin transfer molding process, and to ameliorate any such void formations.

Prior to, contemporaneous with, or after executing the operation or operations associated with terminal block 501, method 500 of FIG. 6 proceeds to process block 503 with processor-executable instructions to receive an alignment signal that indicates a fiber-based preform has been placed in a mold cavity of the molding system. By way of non-limiting example, the RTM system controller 25 receives an electronic (start) signal, e.g., from a system operator's graphical user interface (GUI), a capacitive or inductive proximity sensor within the mold cavity 15, or as part of a general control sequence for automated manufacture of composite-material parts, that indicates a fiber-based preform 14 is placed within the mold cavity 15 and is properly aligned with respect to the upper and lower mold segments 11, 13. At process block 505, another electronic signal may be received to confirm that the opposing mold segments of the RTM apparatus have been closed and are sealed shut.

After the RTM system's electronic control unit confirms that a preform is inside the mold cavity and the tooling dies have been sealed, method 500 proceeds to decision block 507 to determine if an air gap or other measurable void is present between an outer surface of the preform and a tool face of a tooling die. As indicated above in the discussion of FIGS. 2-5, manufacturing variations in and inconsistent placement of a preform or a preform's reinforcement patch may lead to inadvertent voids at a transition area between preform sections having differing thicknesses. To detect such voids, one or both tooling dies may be equipped with inductive, ultrasonic, and/or infrared sensors that monitor a surface profile of an inserted preform to ascertain whether or not a void larger than a threshold minimum size is present between the preform and tool die surface. It is envisioned that the evaluation carried out at decision block 507 may be omitted from the method 500, for example, in RTM systems and apparatuses that employ passive means for filling unwanted mold-cavity air gaps and other voids. If no such void is present (block 507=NO), method 500 moves to process block 511, which will be described below.

Responsive to a determination that a void of a predetermined minimum size is in fact present inside the mold cavity (block 507=YES), method 500 continues to process block 509 with instructions to introduce a filler into the detected void between the fiber-based preform and the tool face of the mold segment. The filler introduced at process block 509 may take on any of the options and variations described above, including any of the filler devices described with respect to FIGS. 2-5. The operation or operations set forth in process block 509 may be automated, manual, or a combination of both. For instance, process block 509 may comprise memory-stored instructions for a system controller, such as RTM system ECU 25 of FIG. 1, to govern operation of the air-driven fiber chopper 142 and pneumatic fiber-spray gun 144 to modulate the volume of chopped-fiber filler 146 sprayed into void 127. Alternatively, process block 509 may merely comprise output of an electronic warning or other signal to prompt a service attendant to apply a filler or filler device in any of the manners disclosed herein.

RTM system ECU 25 may thereafter execute instructions associated with process block 511 and transmit one or more command signals, e.g., to primary vent 28 of FIG. 1, to evacuate air from the moldy cavity, and then, e.g., to the resin pump 26 of FIG. 1, to begin injecting pressurized resin 22 into the mold cavity 15 through the primary gate 20. In so doing, a resin flow rate is induced within the mold cavity 15; the continued flow of pressurized resin 22 will impregnate the fiber-based preform 14. If no defects are detected or otherwise anticipated, resin injection may be temporarily halted and the resin-impregnated fiber-based preform 14 is cured, e.g., via a command signal from the controller 25 to a system heating element (not shown) to elevate mold temperature past a calibrated thermoset (glass-transition) temperature. If desired, curing may be assisted via introduction of a catalyst or other curing agent, and/or by elevating pressure within the mold cavity 15. Prior to, contemporaneous with, or after molding and cure of the injected resin, a prompt signal is sent to remove the molded part from the mold 12, as indicated at block 513. Method 500 may thereafter terminate at terminal block 515 or may circle back to terminal block 501 and run in a continuous loop, e.g., to fabricate multiple FRP parts.

Aspects of this disclosure may be implemented, in some embodiments, through a computer-executable program of instructions, such as program modules, generally referred to as software applications or application programs executed by any of a controller or the controller variations described herein. Software may include, in non-limiting examples, routines, programs, objects, components, and data structures that perform particular tasks or implement particular data types. The software may form an interface to allow a computer to react according to a source of input. The software may also cooperate with other code segments to initiate a variety of tasks in response to data received in conjunction with the source of the received data. The software may be stored on any of a variety of memory media, such as CD-ROM, magnetic disk, bubble memory, and semiconductor memory (e.g., various types of RAM or ROM).

Moreover, aspects of the present disclosure may be practiced with a variety of computer-system and computer-network configurations, including multiprocessor systems, microprocessor-based or programmable-consumer electronics, minicomputers, mainframe computers, and the like. In addition, aspects of the present disclosure may be practiced in distributed-computing environments where tasks are performed by resident and remote-processing devices that are linked through a communications network. In a distributed-computing environment, program modules may be located in both local and remote computer-storage media including memory storage devices. Aspects of the present disclosure may therefore be implemented in connection with various hardware, software or a combination thereof, in a computer system or other processing system.

Any of the methods described herein may include machine readable instructions for execution by: (a) a processor, (b) a controller, and/or (c) any other suitable processing device. Any algorithm, software, control logic, protocol or method disclosed herein may be embodied as software stored on a tangible medium such as, for example, a flash memory, a CD-ROM, a floppy disk, a hard drive, a digital versatile disk (DVD), or other memory devices. The entire algorithm, control logic, protocol, or method, and/or parts thereof, may alternatively be executed by a device other than a controller and/or embodied in firmware or dedicated hardware in an available manner (e.g., implemented by an application specific integrated circuit (ASIC), a programmable logic device (PLD), a field programmable logic device (FPLD), discrete logic, etc.). Further, although specific algorithms are described with reference to flowcharts depicted herein, many other methods for implementing the example machine-readable instructions may alternatively be used.

Aspects of the present disclosure have been described in detail with reference to the illustrated embodiments; those skilled in the art will recognize, however, that many modifications may be made thereto without departing from the scope of the present disclosure. The present disclosure is not limited to the precise construction and compositions disclosed herein; any and all modifications, changes, and variations apparent from the foregoing descriptions are within the scope of the disclosure as defined by the appended claims. Moreover, the present concepts expressly include any and all combinations and subcombinations of the preceding elements and features.

What is claimed:

1. A method of forming a composite-material construction using a molding system, the molding system including first and second mold segments defining therebetween a mold cavity, a primary gate and a primary vent both fluidly connected to the mold cavity, and an electronic control unit regulating operation of the molding system, the method comprising:

receiving, via the electronic control unit, an alignment signal indicating a fiber-based preform is placed in the mold cavity, the fiber-based preform including adjoining first and second preform sections with first and second preform thicknesses, respectively, and a stepped preform region connecting the first and second preform sections;

receiving, via the electronic control unit, a sealed signal indicating the first and second mold segments are sealed together, the first mold segment including adjoining first and second tool sections with first and second tool thicknesses, respectively, and a stepped tool region connecting the first and second tool sections;

introducing a filler into a void in the mold cavity between the fiber-based preform and a first tool face of the first mold segment, wherein the filler is moved into the void and interposed between the stepped tool region and the stepped preform region;

transmitting, via the electronic control unit to a resin pump, an injection command signal to inject resin through the primary gate and into the mold cavity to thereby impregnate the fiber-based preform with the resin; and transmitting, via the electronic control unit to the primary vent, an evacuation command signal to evacuate air from the mold cavity.

2. The method of claim 1, wherein the filler includes a metered volume of a chopped-fiber filler configured to substantially fill the void between the fiber-based preform and the first tool face.

3. The method of claim 2, wherein the fiber-based preform has a first volume fraction of fiber and the chopped-fiber filler has a second volume fraction of fiber less than the first volume fraction of fiber.

4. The method of claim 3, wherein the second volume fraction of fiber is approximately 10-60% of the first volume fraction of fiber.

5. The method of claim 2, wherein the filler further includes a thermoplastic or thermoset binder configured to attach the chopped-fiber filler to the fiber-based preform.

6. The method of claim 5, wherein the filler includes about 0.25% to about 10% by weight of the thermoplastic or thermoset binder.

7. The method of claim 2, wherein the chopped-fiber filler is a spray-chopped reinforcing fiber bed composed of glass, carbon, aramid, metal, boron, and/or basalt fibers with a diameter of about 3-30 micrometers ($\mu$m).

8. The method of claim 1, wherein the filler includes a compressible shim attached to the first mold segment and configured to substantially fill the void between the fiber-based preform and the first tool face.

9. The method of claim 8, wherein the compressible shim includes an elastomeric cushion projecting from the first tool face of the first mold segment and comprised of a silicone rubber, a neoprene rubber, and/or a fluoroelastomer rubber.

10. The method of claim 8, wherein the compressible shim includes an inflatable bladder, and wherein the mold system further includes a hydraulic or pneumatic actuator fluidly connected to the inflatable bladder and configured to selectively expand the inflatable bladder to thereby project from the first tool face.

11. The method of claim 1, wherein the filler includes a cluster of pins movably attached to the first mold segment and cooperatively configured to substantially fill the void between the fiber-based preform and the first tool face.

12. The method of claim 11, wherein each pin in the cluster of pins is independently actuable to project from the first tool face into the void.

13. The method of claim 12, further comprising a plurality of biasing members each configured to bias a respective one of the pins from the first tool face.

14. A method of forming a composite-material construction using a molding system, the molding system including first and second mold segments defining therebetween a mold cavity, a primary gate and a primary vent both fluidly connected to the mold cavity, and an electronic control unit regulating operation of the molding system, the method comprising:
- receiving, via the electronic control unit, an alignment signal indicating a fiber-based preform is placed in the mold cavity;
- receiving, via the electronic control unit, a sealed signal indicating the first and second mold segments are sealed together;
- introducing a filler into a void between the fiber-based preform and a first tool face of the first mold segment, the filler including a plurality of pins movably attached to the first mold segment and cooperatively configured to substantially fill the void between the fiber-based preform and the first tool face;
- transmitting, via the electronic control unit to a resin pump, an injection command signal to inject resin through the primary gate and into the mold cavity to thereby impregnate the fiber-based preform with the resin; and
- transmitting, via the electronic control unit to the primary vent, an evacuation command signal to evacuate air from the mold cavity.

15. The method of claim 14, wherein the first mold segment includes adjoining first and second tool sections with first and second tool thicknesses, respectively, and a stepped tool region connecting the first and second tool sections, wherein the fiber-based preform includes adjoining first and second preform sections with first and second preform thicknesses, respectively, and a stepped preform region connecting the first and second preform sections, and wherein the pins, when filling the void, are interposed between the stepped tool region and the stepped preform region.

16. The method of claim 14, wherein each of the pins is independently actuable to project from the first tool face and into the void.

17. The method of claim 14, further comprising a plurality of biasing members configured to bias the pins into the void.

18. The method of claim 14, wherein the pins are movably mounted within an internal compartment of the first mold segment and actuable to project out of the internal compartment and into the void between the fiber-based preform and the first tool face.

19. The method of claim 14, wherein the plurality of pins includes a cluster of elongated cylindrical pins.

20. The method of claim 19, wherein each of the elongated cylindrical pins has a polyhedral geometry with peripheral surfaces slidably abutting peripheral surfaces of neighboring ones of the pins.

* * * * *